(12) United States Patent
Ren et al.

(10) Patent No.: US 12,216,072 B2
(45) Date of Patent: Feb. 4, 2025

(54) RETICLE THERMAL EXPANSION CALIBRATION METHOD CAPABLE OF IMPROVING SUB-RECIPE

(71) Applicant: United Semiconductor (Xiamen) Co., Ltd., Fujian (CN)

(72) Inventors: Maohua Ren, Shamen (CN); Yuan-Chi Pai, Fujian (CN); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 744 days.

(21) Appl. No.: 17/408,481

(22) Filed: Aug. 22, 2021

(65) Prior Publication Data
US 2023/0030500 A1 Feb. 2, 2023

(30) Foreign Application Priority Data
Aug. 2, 2021 (CN) .......................... 202110879709.3

(51) Int. Cl.
*G01N 25/16* (2006.01)
*G01B 5/00* (2006.01)
*G03B 27/42* (2006.01)

(52) U.S. Cl.
CPC .......... *G01N 25/16* (2013.01); *G01B 5/0014* (2013.01); *G03B 27/42* (2013.01)

(58) Field of Classification Search
CPC ........ G01N 25/16; G01B 5/0014; G03F 7/75; G03F 7/00; G03F 7/70633; G03F 7/70525; G03F 9/7003; G03F 7/70508; G03F 7/70875
See application file for complete search history.

(56) References Cited

U.S. PATENT DOCUMENTS

| | | | | |
|---|---|---|---|---|
| 5,581,324 | A | * 12/1996 | Miyai | ................. G03F 7/70258 355/53 |
| 6,871,169 | B1 | * 3/2005 | Hazen | .................. G01N 21/359 703/2 |
| 8,486,587 | B2 | 7/2013 | Tsai | |
| 9,275,933 | B2 | 3/2016 | Kuo | |
| 9,748,139 | B1 | 8/2017 | Liou | |
| 9,761,791 | B2 | 9/2017 | Shiu | |

(Continued)

FOREIGN PATENT DOCUMENTS

| | | |
|---|---|---|
| CN | 106200275 A | 12/2016 |
| CN | 110865514 A | 3/2020 |

(Continued)

OTHER PUBLICATIONS

17408481_2024-05-01_GB_2302637_A_H.pdf, Jan. 22, 1997.*

(Continued)

*Primary Examiner* — Gail Kaplan Verbitsky
(74) *Attorney, Agent, or Firm* — Winston Hsu

(57) ABSTRACT

A reticle thermal expansion calibration method includes exposing a group of wafers and generating a sub-recipe, performing data mining and data parsing to generate a plurality of overlay parameters, extracting a plurality of predetermined parameters from the plurality of overlay parameters, performing a linear regression on each of the predetermined parameters, and generating a coefficient of determination for each of the predetermined parameters.

10 Claims, 7 Drawing Sheets

(56) References Cited

U.S. PATENT DOCUMENTS

| | | | |
|---|---|---|---|
| 10,062,943 B2 | 8/2018 | Li | |
| 10,090,465 B2 | 10/2018 | Hsu | |
| 10,109,474 B1 | 10/2018 | Wang | |
| 10,153,342 B1 | 12/2018 | He | |
| 10,262,986 B2 | 4/2019 | Dai | |
| 10,429,749 B2* | 10/2019 | Kant | G03F 7/705 |
| 10,460,980 B2 | 10/2019 | Verma | |
| 11,288,240 B1* | 3/2022 | Sayad | G06F 16/906 |
| 2002/0192598 A1* | 12/2002 | Hirayanagi | G03F 1/84 430/311 |
| 2003/0186141 A1* | 10/2003 | Park | G03F 7/70466 430/30 |
| 2003/0204282 A1* | 10/2003 | Oishi | G03F 7/705 700/121 |
| 2005/0136346 A1 | 6/2005 | Ottens | |
| 2005/0154484 A1* | 7/2005 | Lee | G03F 7/70633 700/121 |
| 2006/0119830 A1* | 6/2006 | Ottens | G03F 7/70516 355/77 |
| 2008/0094642 A1* | 4/2008 | Okita | G03F 9/7092 702/94 |
| 2009/0063378 A1* | 3/2009 | Izikson | G03F 7/70633 706/21 |
| 2009/0323039 A1 | 12/2009 | Wardenier | |
| 2010/0020296 A1* | 1/2010 | Kuit | G03F 7/707 355/30 |
| 2014/0272717 A1* | 9/2014 | Cheng | G03F 7/00 716/55 |
| 2017/0109646 A1* | 4/2017 | David | G03F 7/70625 |
| 2018/0275525 A1 | 9/2018 | Bow | |

FOREIGN PATENT DOCUMENTS

| | | | | |
|---|---|---|---|---|
| CN | 112612183 A | | 4/2021 | |
| CN | 118159912 A | * | 6/2024 | G03F 7/705 |
| EP | 1235109 A1 | * | 8/2002 | G03F 7/70633 |
| EP | 3 396 456 A1 | | 10/2018 | |
| GB | 2302637 A | * | 1/1997 | H01J 9/44 |
| JP | H0922120 A | * | 1/1997 | |
| JP | H10223506 A | * | 8/1998 | |
| JP | H11354401 A | * | 12/1999 | |
| JP | 2001110705 A | * | 4/2001 | |
| JP | 2005109137 A | * | 4/2005 | |
| JP | 2014529909 A | * | 11/2014 | |
| KR | 2001058692 A | * | 7/2001 | |
| KR | 100555467 B1 | * | 3/2006 | |
| WO | WO-0068980 A1 | * | 11/2000 | G03F 7/70058 |
| WO | WO-0210726 A2 | * | 2/2002 | G01N 21/274 |
| WO | WO-2017089391 A1 | * | 6/2017 | G01B 7/20 |
| WO | WO-2024132326 A1 | * | 6/2024 | |

OTHER PUBLICATIONS

17408481_2024-05-01_JP_2005109137_A_H.pdf,2,005-04-21.*
17408481_2024-05-01_KR_100555467_B1_H.pdf,Mar. 3, 2006.*
17408481_2024-07-10_JP_2014529909_A_H.pdf,Nov. 13, 2014.*
17408481_2024-07-10_EP_1235109_A1_H.pdf,Aug. 28, 2002.*
17408481_2024-08-30_JP_2001110705_A_H.pdf,Apr. 20, 2001.*
17408481_2024-08-30_JP_H10223506_A_H.pdf,Aug. 21, 1998.*
17408481_2024-08-30_JP_H11354401_A_H.pdf,Dec. 24, 1999.*
17408481_2024-11-18_CN_118159912_A_H.pdf,Jun. 7, 2024.*
17408481_2024-11-18_WO_0068980_A1_H.pdf,Nov. 16, 2000.*
17408481_2024-11-18_WO_2017089391_A1_H.pdf,Jun. 1, 2017.*
17408481_2024-11-18_WO_2024132326_A1_H.pdf,Jun. 27, 2024.*
17408481_2024-11-18_JP_H0922120_A_H.pdf,Jan. 21, 1997.*

* cited by examiner

RETICLE THERMAL EXPANSION CALIBRATION METHOD CAPABLE OF IMPROVING SUB-RECIPE

BACKGROUND OF THE INVENTION

1. Field of the Invention

The present invention relates a reticle thermal expansion calibration method, and more particularly, to a reticle thermal expansion calibration method which can calibrate the sub-recipe to improve the sub-recipe.

2. Description of the Prior Art

During the exposure of wafers, the reticle is heated by deep ultraviolet light, which not only deforms the reticle, but also causes side effects to the wafers. In order to fix the problem of improper exposure, ASML Holding N.V. provides a reticle heating calibration method. It uses the temperature of the reticle during wafer exposure to predict the impact of exposing the next batch of wafers, and corrects the exposure alignment to reduce the potential risk of erroneous exposure overlay caused by the thermal expansion of the reticle. However, in the foundry field, there is no way to calibrate the sub-recipe for wafer exposure when the sub-recipe is inappropriate. The correction of the exposure alignment alone does not solve the real issue, and can easily cause the wafers to fail and damage their yield.

SUMMARY OF THE INVENTION

An embodiment discloses a reticle thermal expansion calibration method. The method comprises exposing a first group of wafers and generating a first sub-recipe, performing data mining and data parsing to generate a plurality of overlay parameters, extracting a plurality of predetermined parameters from the plurality of overlay parameters, performing a linear regression on each of the predetermined parameters, and generating a first coefficient of determination for each of the predetermined parameters.

Another embodiment discloses a reticle thermal expansion calibration method. The method comprises exposing a first group of wafers and generating a first sub-recipe, performing data mining and data parsing to generate a plurality of overlay parameters, performing a linear regression on each of the overlay parameters, and generating a first coefficient of determination for each of the overlay parameters.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
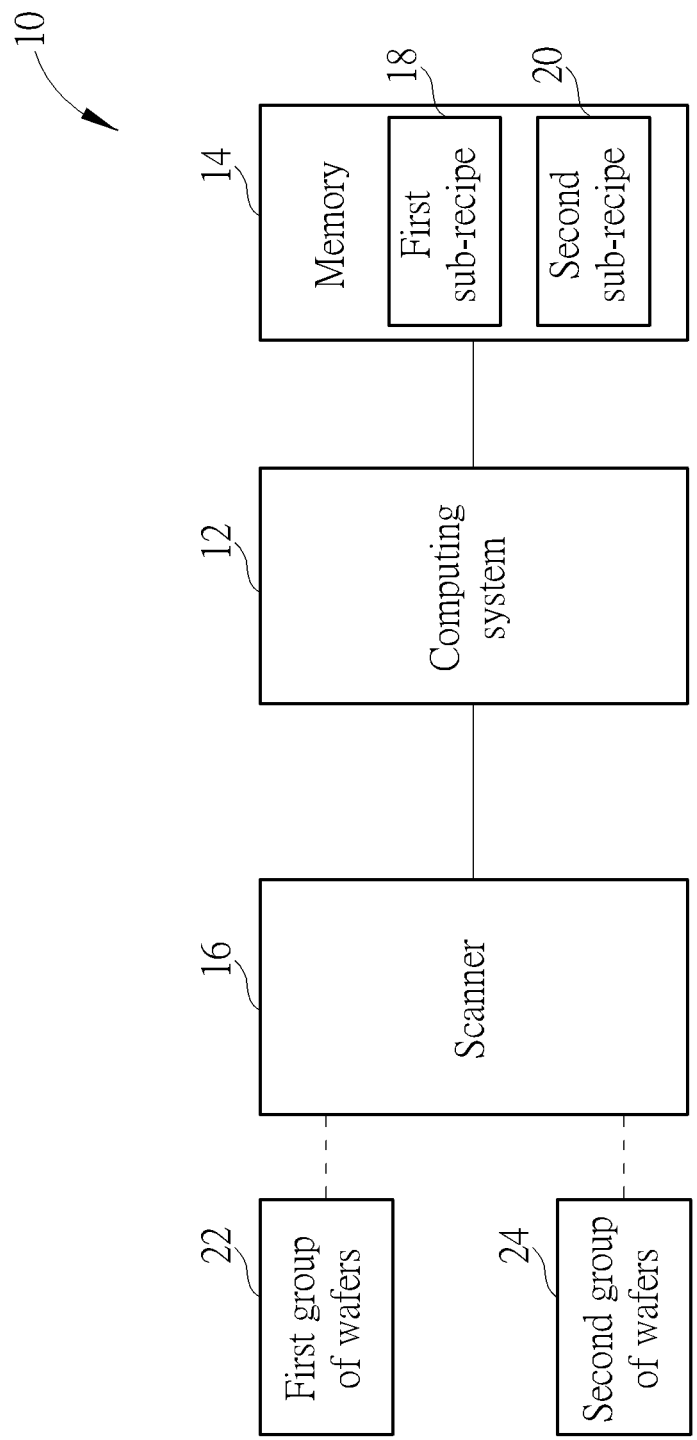
FIG. 1 is a schematic diagram of a reticle thermal expansion calibration system according to an embodiment of the present invention.
Figure 2:
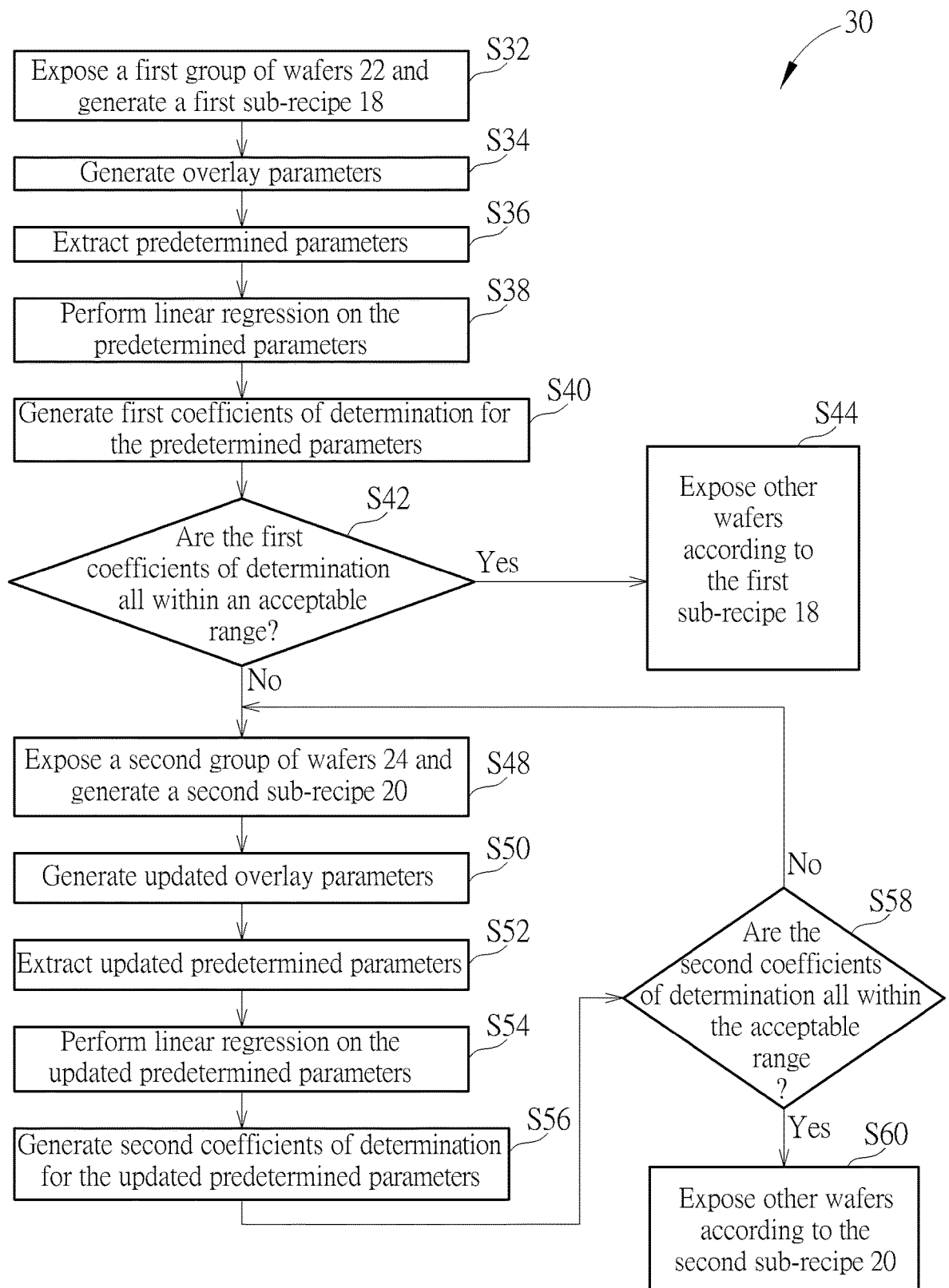
FIG. 2 is a flowchart of a reticle thermal expansion calibration method according to an embodiment of the present invention.

FIG. 1 is a schematic diagram of a reticle thermal expansion calibration system 10 according to an embodiment. The reticle thermal expansion calibration system 10 comprises a computing system 12, a memory 14 and a scanner 16. The memory 14 and the scanner 16 are coupled to the computing system 12. The memory 14 can store a first sub-recipe 18 and a second sub-recipe 20 when the computing system 12 generates the first sub-recipe 18 and the second sub-recipe 20 respectively. FIG. 2 is a flowchart of a reticle thermal expansion calibration method 30 according to an embodiment of the present invention. The reticle thermal expansion calibration method 30 comprises the following steps:

Step S32: the scanner 16 exposes a first group of wafers 22 and generates the first sub-recipe 18;

Step S34: the computing system 12 performs data mining and data parsing to generate a plurality of overlay parameters;

Step S36: the computing system 12 extracts a plurality of predetermined parameters from the plurality of overlay parameters;

Step S38: the computing system 12 performs linear regression on each of the predetermined parameters;

Step S40: the computing system 12 generates a first coefficient of determination for each of the predetermined parameters;

Step S42: are first coefficients of determination of the predetermined parameters all within an acceptable range? If so, go to step S44; else go to step S48;

Step S44: the scanner 16 exposes other wafers according to the first sub-recipe 18.

Step S48: the scanner 16 exposes a second group of wafers 24 and generates the second sub-recipe 20;

Step S50: the computing system 12 performs data mining and data parsing to generate a plurality of updated overlay parameters;

Step S52: the computing system 12 extracts a plurality of updated predetermined parameters from the plurality of updated overlay parameters;

Step S54: the computing system 12 performs linear regression on each of the updated predetermined parameters;

Step S56: the computing system 12 generates a second coefficient of determination for each of the updated predetermined parameters;

Step S58: are second coefficients of determination of the updated predetermined parameters all within the acceptable range? If so, go to step S60; else use a third group of wafers to replace the second group of wafers 24 to perform step S48 to update the second sub-recipe 20;

Step S60: the scanner 16 exposes other wafers according to the second sub-recipe 20.

In Step S32, suppose the first group of wafers 22 includes 25 wafers, during the exposure of the first group of wafers 22, the scanner 16 sequentially exposes the first to 25th wafers of the first group of wafers 22. Each wafer can be exposed more than one hundred times. The sensor of the scanner 16 will collect the temperature change and distribution accumulated on the reticle when the scanner 16 performs more than one hundred exposures on each wafer. The ASML computer of the computing system 12 developed by ASML Holding N.V. then generates the first sub-recipe 18 based on the data such as accumulated temperature change and distribution on the reticle. When the scanner 16 exposes a wafer of the first group of wafers 22, the data collected from a previous wafer can be used for rough compensation. For example, when the scanner 16 exposes the third wafer of the first group of wafers 22, the data collected from the exposing the second wafer of the first group of wafers 22 can be used for rough compensation. In step S48, the second sub-recipe 20 is generated in the same manner, and will not be repeated here.

Figure 3:
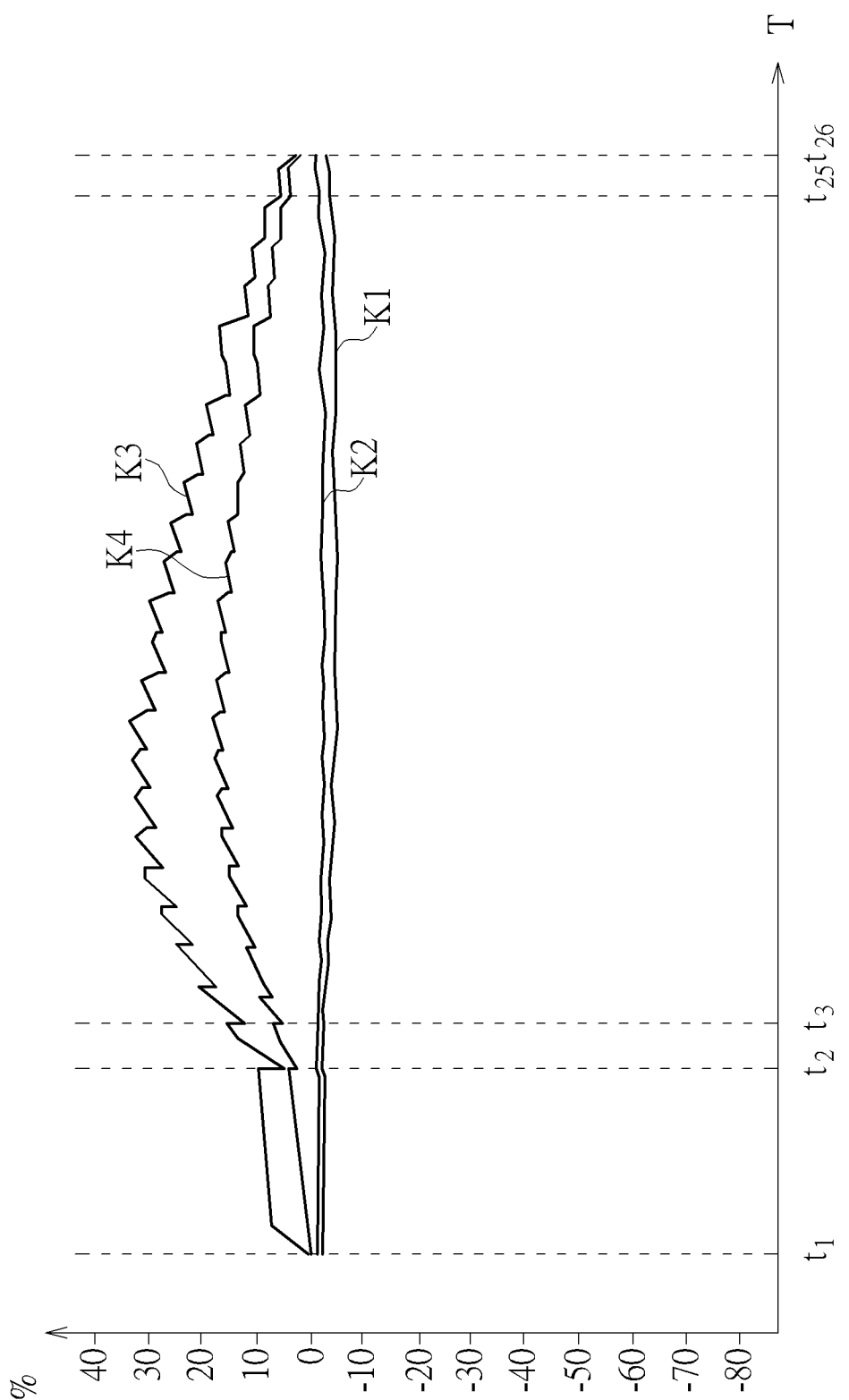
FIG. 3 is a schematic diagram exemplified by 4 overlay parameters generated by the computing system in FIG. 1.

In Step S34 and S50, the computing system 12 can use a computer different from the ASML computer to perform data mining and data analysis to generate the plurality of overlay parameters and the plurality of updated overlay parameters respectively. FIG. 3 is a schematic diagram exemplified by 4 overlay parameters K1 to K4 generated by the computing system 12. In the embodiment, the number of overlay parameters can be 39 or another number, but for the sake of simplicity, FIG. 3 is only exemplified by 4 overlay parameters K1 to K4. In FIG. 3, the horizontal axis T is the time for exposing the 25 wafers sequentially with the same reticle. For example, $t_1$ to $t_2$ is the time to expose the first wafer, $t_2$ to $t_3$ is the time to expose the second wafer, $t_{25}$ to $t_{26}$ is the time to expose the 25th wafer, etc. The vertical axis % indicates the bias of each overlay parameter in percentage. The bias can be a positive or negative number. For example, 10 denoted on the vertical axis refers to a bias of 10%,-20 denoted on the vertical axis refers to a bias of-20%. In Step S36, the computing system 12 extracts the plurality of predetermined parameters from the plurality of overlay parameters. For instance, the computing system 12 may fetch 20 predetermined parameters from 39 overlay parameters. The 20 predetermined parameters are more relevant to reticle thermal expansion than the remaining 19 overlay parameters, thus are selected as predetermined parameters.

Assume that among the four overlay parameters K1 to K4 in FIG. 3, the overlay parameter K1 is the horizontal translation of the overlay of the exposed patterns on the wafers, the overlay parameter K2 is the vertical translation of the overlay of the exposed patterns on the wafers, the overlay parameter K3 is the horizontal magnification of the overlay of the exposed patterns on the wafers, and the overlay parameter K4 is the vertical magnification of the overlay of the exposed patterns on the wafers. Assuming that at the overlay parameter K1, the exposed patterns on the wafers translated towards right correspond to positive numbers, and the exposed patterns on the wafers translated towards left correspond to negative numbers, then it can be seen from FIG. 3 that the exposure patterns on the wafers are translated towards left. Assuming that at the overlay parameter K2, the exposed patterns on the wafers translated towards an upper side correspond to positive numbers, and the exposed patterns on the wafers translated towards a lower side correspond to negative numbers, then it can be seen from FIG. 3 that the exposure patterns on the wafers are translated towards the lower side. In addition, since the biases of the overlay parameters K3 and K4 are positive, it can be seen that the reticle experiences thermal expansion instead of contraction during exposure.

Two overlay parameters K1 and K2 of the four overlay parameters K1 to K4 are not predetermined parameters, and two overlay parameters K3 and K4 of the four overlay parameters K1 to K4 are predetermined parameters because the overlay parameters K1, K2 are unrelated to reticle thermal expansion, and the overlay parameters K3 and K4 are related to reticle thermal expansion. Therefore, in step S38, the computing system 12 can perform linear regression on the predetermined parameters K3 and K4. After the predetermined parameters K3 and K4 perform linear regression, the slope of each line segment changes greatly. For example, after the scanner 16 exposes the 10th wafer, the overlay parameters K3 and K4 start to decrease instead of continuing to increase. This is contrary to the ideal state where the bias should be proportional to the number of exposed wafers. Therefore, the predetermined parameters K3 and K4 should be corrected.

In steps S40 and S56, the computing system 12 generates the first coefficient of determination of each predetermined parameter according to the following equation. The equation is described by the predetermined parameter j as follows. The predetermined parameter j may be, for example, predetermined parameters K3 and K4:

$$R_j^2 = 1 - \frac{\sum_{i=1}^{N}(ActY_i - PredY_i)^2}{\sum_{i=1}^{N}(ActY_i - Avg(ActY))^2}$$

where:

$R_j^2$ is the first coefficient of determination of the predetermined parameter j;

N is the number of wafers of the first group of wafers 22, N being an integer greater than 2;

$ActY_i$ is an actual value of an ith wafer of the first group of wafers 22 corresponding to the predetermined parameter j;

$PredY_i$ is a predicated value of the ith wafer of the first group of wafers 22 corresponding to the predetermined parameter j; and Avg(ActY) is an average value of the first group of wafers 22 corresponding to each of the predetermined parameter j.

If $1 \geq R_j^2 > 0.9$, the first coefficient of determination is within the acceptable range. If the first coefficients of determination of all of the predetermined parameters are all within the acceptable range, that means the bias of each of the predetermined parameters K3, K4 is substantially proportional to the number of exposed wafers, then the computing system 12 controls the scanner 16 to expose following wafers according to the first sub-recipe 18.

Figure 4:
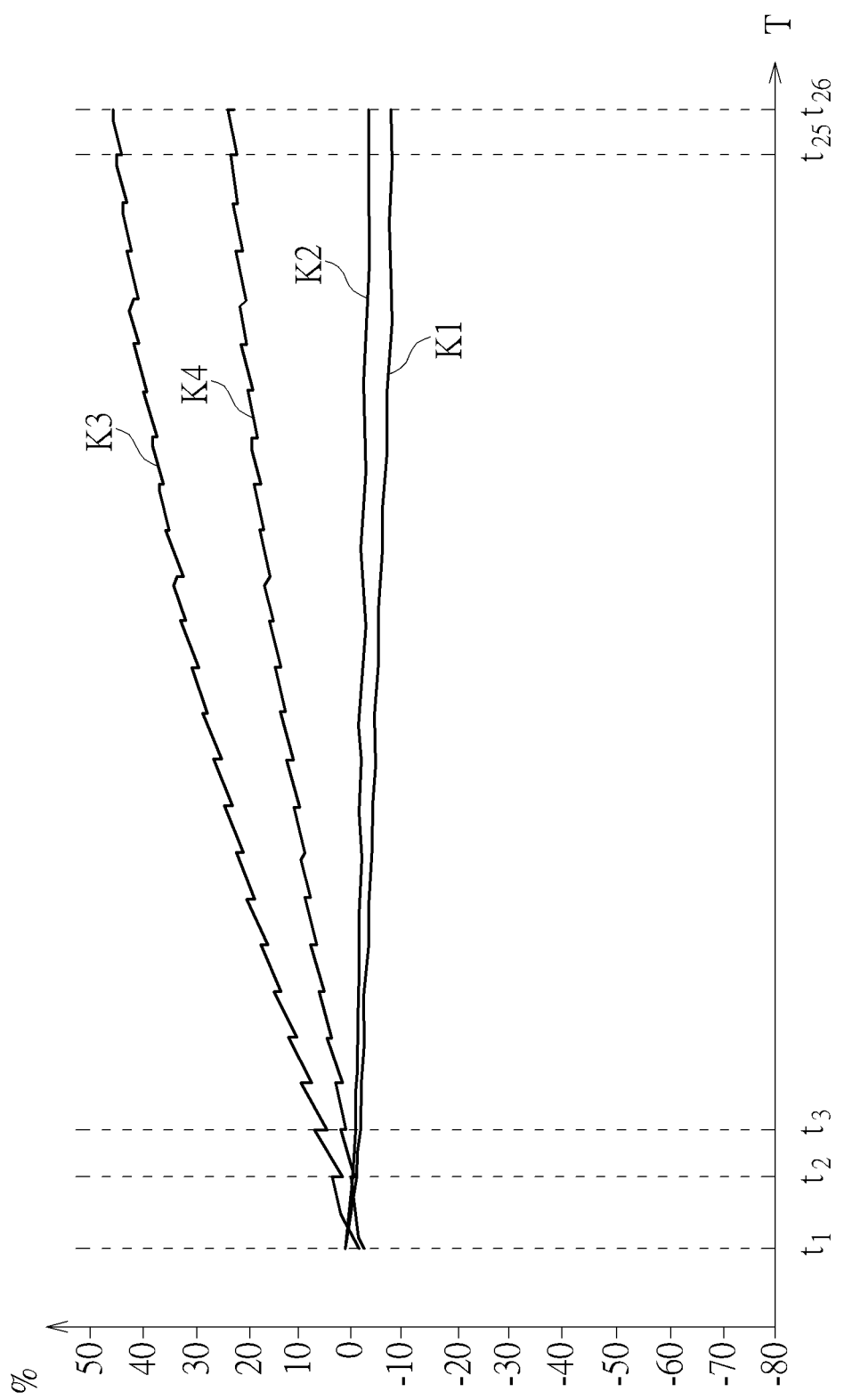
FIG. 4 is a schematic diagram exemplified by 4 updated overlay parameters generated by the computing system in FIG. 1.

If the first coefficient of determination of at least one of the predetermined parameters generated in step S40 is not in the acceptable range, that is, $0.9 \geq R_j^2$, it means that not all of the biases of the predetermined parameters K3 and K4 are almost proportional to the number of exposed wafers, the computing system 12 needs to perform step S48 for the scanner 16 to expose the second group of wafers 24 and generate the second recipe 20. The second group of wafers 24 is different from the first group of wafers 22. The computing system 12 performs data mining and data analysis in step S50 to generate a plurality of updated overlay parameters. Following the embodiment in FIG. 3, the updated overlay parameters are still the overlay parameters K1 to K4, but have different biases. FIG. 4 is a schematic diagram of the computing system 12 generating 4 updated overlay parameters K1 to K4, as in FIG. 3, in FIG. 4, the horizontal axis T refers to the time for exposing 25 wafers in sequence with the same reticle. The vertical axis % refers to the bias of each overlay parameter, which can be a positive or negative number. Since the predetermined parameters are preset in the computing system 12, the updated predetermined parameters extracted by the computing system 12 from the updated overlay parameters K1 to K4 in step S52 are still K3 and K4.

In step S54, the computing system 12 performs linear regression on the updated predetermined parameters K3 and K4. After performing linear regression on the updated predetermined parameters K3 and K4, the change in the slope of each line segment is very limited. For example, when the scanner 16 exposes the first to the 25th wafers, the biases of the overlay parameters K3 and K4 increase steadily, which is close to the ideal state where the biases should be proportional to the number of exposed wafers. Therefore, the predetermined parameters K3 and K4 need no longer be calibrated.

In step S56, the computing system 12 generates second coefficients of determination for the updated predetermined parameters K3 and K4, and the equation for generating the second coefficients of determination is the same as that of step S40, thus will not be repeated here. If the second coefficient of determination for each updated predetermined parameter K3, K4 generated in step S56 is within an acceptable range, that is, $1 \geq R_j^2 > 0.9$, the computing system 12 may control the scanner 16 to expose other wafers according to the second sub-recipe 20. If at least one of the two second coefficients of determination of the two update predetermined parameters K3 and K4 generated in step S56 is not within the acceptable range, that is, $0.9 \geq R_j^2$, which means the bias of at least one of the two update predetermined parameters K3, K4 is not almost proportional to the number of exposed wafers, then in step S48, the scanner 16 can expose a third group of wafers and update the second sub-recipe 20, and the computing system 12 will perform subsequent steps until all of the updated second coefficients of determination are confirmed in step S58 to be within an acceptable range. The third group of wafers is different from the first group of wafers 22 and the second group of wafers 24.

Figure 5:
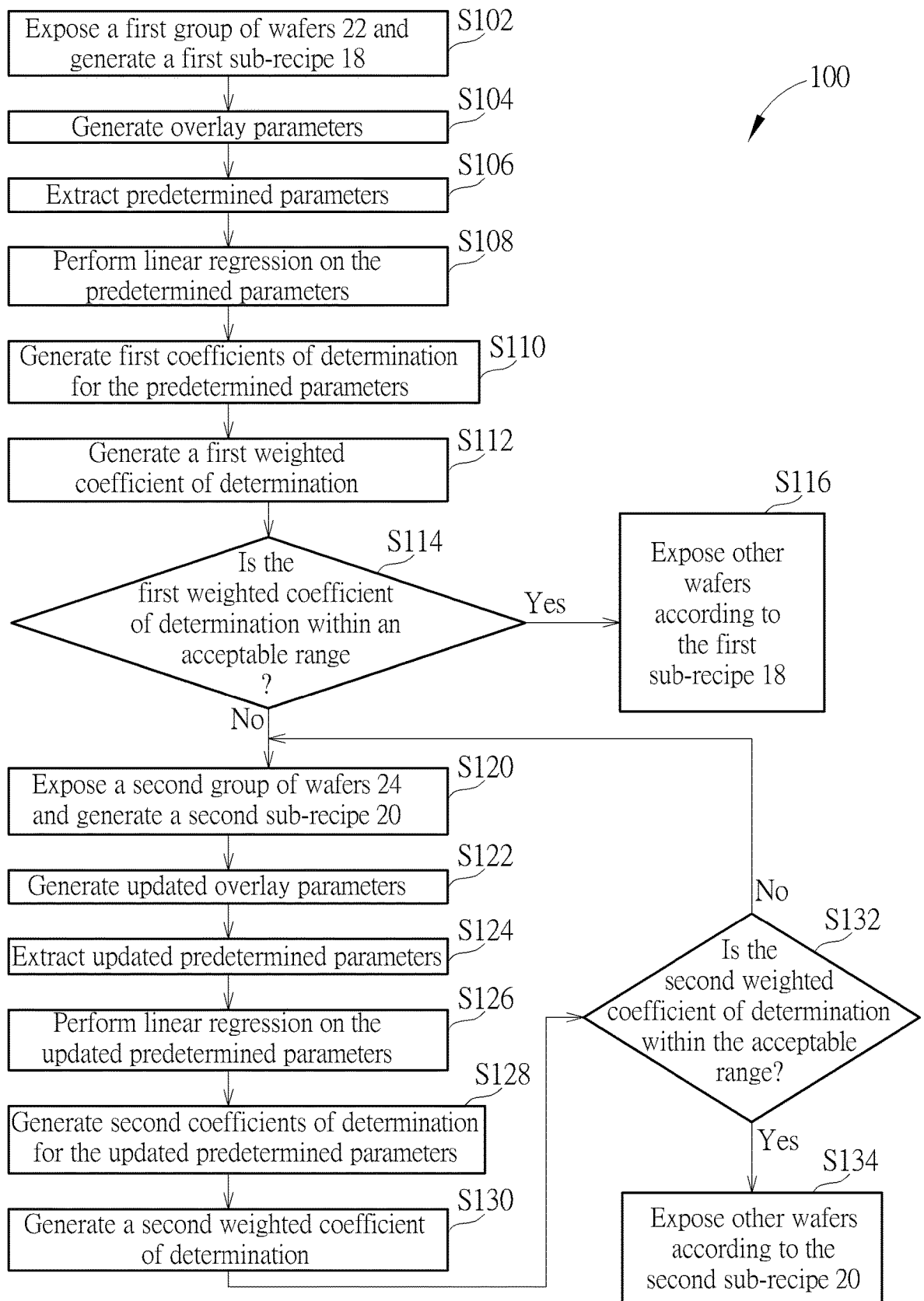
FIG. 5 is a flowchart of a reticle thermal expansion calibration method according to another embodiment of the present invention.

FIG. 5 is a flowchart of a reticle thermal expansion calibration method 100 according to an embodiment of the present invention. The reticle thermal expansion calibration method 100 comprises the following steps:

Step S102: the scanner 16 exposes a first group of wafers 22 and generates the first sub-recipe 18;

Step S104: the computing system 12 performs data mining and data parsing to generate a plurality of overlay parameters;

Step S106: the computing system 12 extracts a plurality of predetermined parameters from the plurality of overlay parameters;

Step S108: the computing system 12 performs linear regression on each of the predetermined parameters;

Step S110: the computing system 12 generates a first coefficient of determination for each of the predetermined parameters;

Step S112: the computing system 12 performs linear combination on the first coefficients of determination of the predetermined parameters to generate a first weighted coefficient of determination;

Step S114: is the first weighted coefficient of determination within the acceptable range? If so, go to step S116; else go to step S120;

Step S116: the scanner 16 exposes other wafers according to the first sub-recipe 18.

Step S120: the scanner 16 exposes a second group of wafers 24 and generates the second sub-recipe 20;

Step S122: the computing system 12 performs data mining and data parsing to generate a plurality of updated overlay parameters;

Step S124: the computing system 12 extracts a plurality of updated predetermined parameters from the plurality of updated overlay parameters;

Step S126: the computing system 12 performs linear regression on each of the updated predetermined parameters;

Step S128: the computing system 12 generates a second coefficient of determination for each of the updated predetermined parameters;

Step S130: the computing system 12 performs linear combination on the second coefficients of determination of the predetermined parameters to generate a second weighted coefficient of determination;

Step S132: is the second weighted coefficient of determination of the updated predetermined parameters within the acceptable range? If so, go to step S134; else use a third group of wafers to replace the second group of wafers 24 to perform step S120 to update the second sub-recipe 20;

Step S134: the scanner 16 exposes other wafers according to the second sub-recipe 20.

Compared with the reticle thermal expansion calibration method 30, the calculation system 12 of the reticle thermal expansion calibration method 100 linearly combines the first coefficients of determination of the predetermined parameters in step S112 to generate the first weighted coefficient of determination. The equation of linear combination is as follows:

$$R^2 = \sum_{j=1}^{M} w_j R_j^2$$

where:
$R^2$ is the first weighted coefficient of determination;
$R_j^2$ is the jth first coefficient of determination;
$w_j$ is the weight of $R_j^2$; and
M is the number of first coefficients of determination.

In step S114, if the first weighted coefficient of determination is in the acceptable range, that is, $1 \geq R^2 > 0.9$, the computing system 12 can control the scanner 16 to expose following wafers according to the first sub-recipe 18 in step S116. In step S114, if the first weighted coefficient of determination is outside the acceptable range, that is, $0.9 \geq R^2$, the scanner 16 can expose the second group of wafers 24 and generate the second sub-recipe 20 in step S120. In step S130, the computing system 12 can perform linear combination on the second coefficients of determination of the predetermined parameters to generate the second weighted coefficient of determination. The second weighted coefficient of determination is generated in the same manner as the first weighted coefficient of determination and is thus not repeated here. In step S132, if the second weighted coefficient of determination is in the acceptable range, that is, $1 \geq R^2 > 0.9$, the computing system 12 can control the scanner 16 to expose following wafers according to the second sub-recipe 20 in step S134. In step S132, if the second weighted coefficient of determination is outside the acceptable range, that is, $0.9 \geq R^2$, the scanner 16 can expose the third group of wafers and update the second sub-recipe 20 in step S120. The computing system 12 then performs subsequent steps until the updated second weighted coefficient of determination is confirmed in step S132 to be within the acceptable range. The third group of wafers is different from the first group of wafers 22 and the second group of wafers 24.

Figure 6:
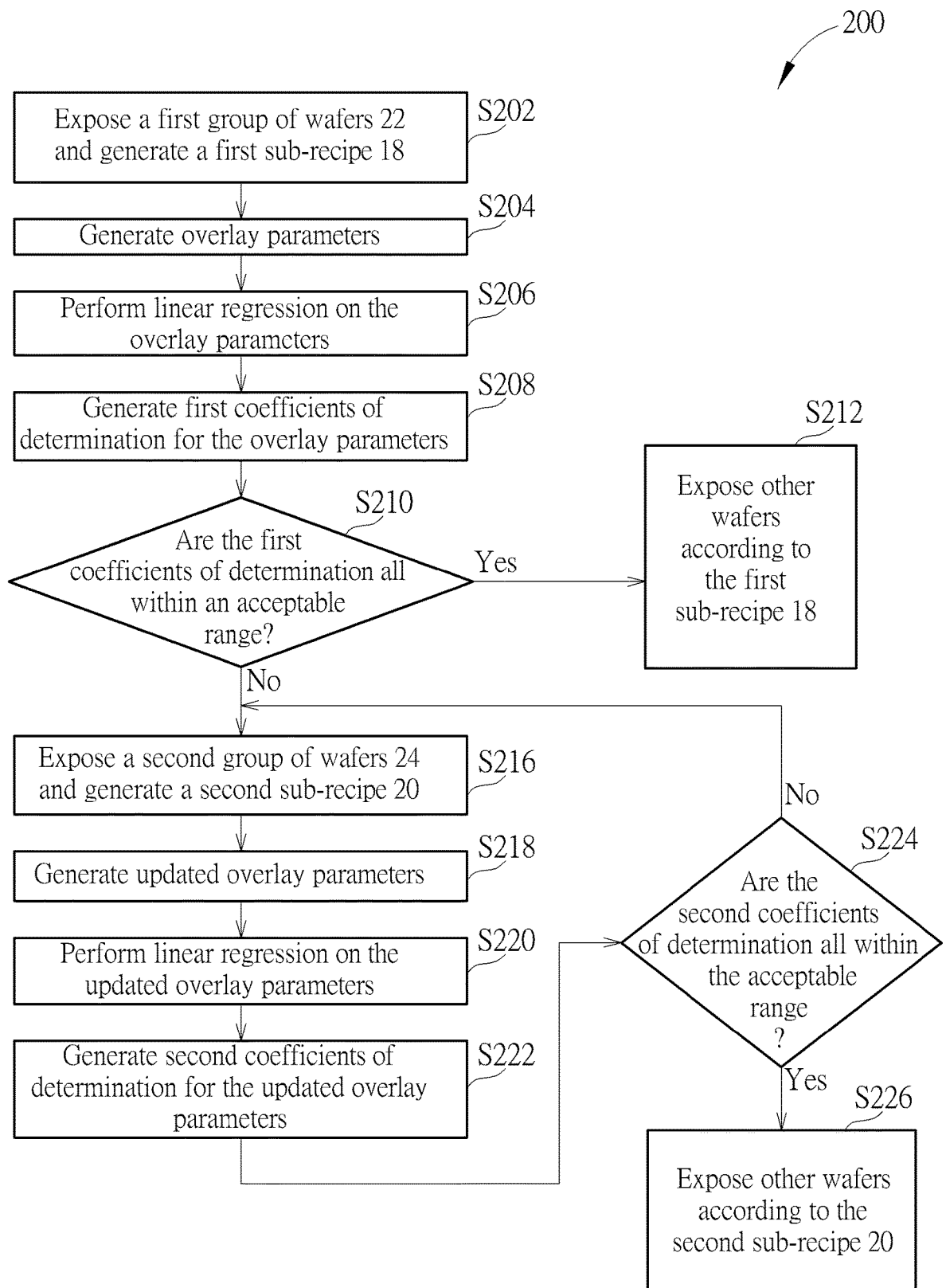
FIG. 6 is a flowchart of a reticle thermal expansion calibration method according to another embodiment of the present invention.

FIG. 6 is a flowchart of a reticle thermal expansion calibration method 200 according to an embodiment of the present invention. The reticle thermal expansion calibration method 200 comprises the following steps:

Step S202: the scanner 16 exposes a first group of wafers 22 and generates the first sub-recipe 18;

Step S204: the computing system 12 performs data mining and data parsing to generate a plurality of overlay parameters;

Step S206: the computing system 12 performs linear regression on each of the overlay parameters;

Step S208: the computing system 12 generates a first coefficient of determination for each of the overlay parameters;

Step S210: are first coefficients of determination of the overlay parameters all within the acceptable range? If so, go to step S212; else go to step S216;

Step S212: the scanner 16 exposes other wafers according to the first sub-recipe 18.

Step S216: the scanner 16 exposes a second group of wafers 24 and generates the second sub-recipe 20;

Step S218: the computing system 12 performs data mining and data parsing to generate a plurality of updated overlay parameters;

Step S220: the computing system 12 performs linear regression on each of the updated overlay parameters;

Step S222: the computing system 12 generates a second coefficient of determination for each of the updated overlay parameters;

Step S224: are second coefficients of determination of the updated overlay parameters all within the acceptable range? If so, go to step S226; else use a third group of wafers to replace the second group of wafers 24 to perform step S216 to update the second sub-recipe 20;

Step S226: the scanner 16 exposes other wafers according to the second sub-recipe 20.

Compared with the reticle thermal expansion calibration method 30, the reticle thermal expansion calibration method 200 does not extract a plurality of predetermined parameters from a plurality of overlay parameters as in step S36, but performs linear regression on each of the overlay parameters in step S206, and generates the first coefficient of determination accordingly. The reticle thermal expansion calibration method 200 also does not extract a plurality of updated predetermined parameters from a plurality of updated overlay parameters as in step S52, but performs linear regression on each of the updated overlay parameters in step S220, and generates the second coefficient of determination accordingly. The reticle thermal expansion calibration method 200 generates the first coefficient of determination and the second coefficient of determination in the same way as the reticle thermal expansion calibration method 30. The difference is that the reticle thermal expansion calibration method 200 generates the first coefficients of determination and the second coefficients of determination for all of the overlay parameters, not just the first coefficients of determination and the second coefficients of determination of the predetermined parameters.

Figure 7:
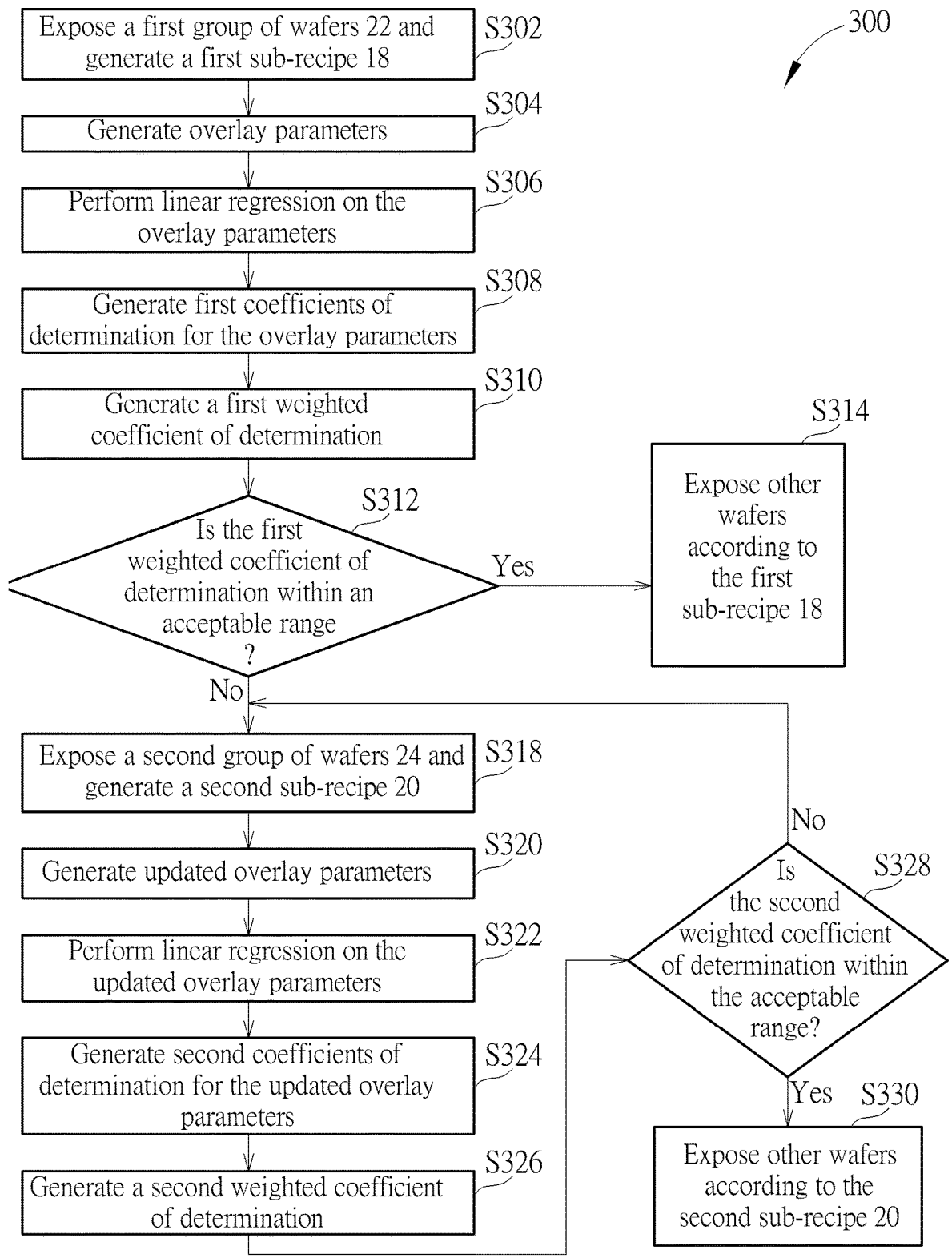
FIG. 7 is a flowchart of a reticle thermal expansion calibration method according to another embodiment of the present invention.

FIG. 7 is a flowchart of a reticle thermal expansion calibration method 300 according to an embodiment of the present invention. The reticle thermal expansion calibration method 200 comprises the following steps:

Step S302: the scanner 16 exposes a first group of wafers 22 and generates the first sub-recipe 18;

Step S304: the computing system 12 performs data mining and data parsing to generate a plurality of overlay parameters;

Step S306: the computing system 12 performs linear regression on each of the overlay parameters;

Step S308: the computing system 12 generates a first coefficient of determination for each of the overlay parameters;

Step S310: the computing system 12 performs linear combination on the first coefficients of determination of the overlay parameters to generate a first weighted coefficient of determination;

Step S312: is the first weighted coefficient of determination within the acceptable range? If so, go to step S314; else go to step S318;

Step S314: the scanner 16 exposes other wafers according to the first sub-recipe 18.

Step S318: the scanner 16 exposes a second group of wafers 24 and generates the second sub-recipe 20;

Step S320: the computing system 12 performs data mining and data parsing to generate a plurality of updated overlay parameters;

Step S322: the computing system 12 performs linear regression on each of the updated overlay parameters;

Step S324: the computing system 12 generates a second coefficient of determination for each of the updated overlay parameters;

Step S326: the computing system 12 performs linear combination on the second coefficients of determination of the overlay parameters to generate a second weighted coefficient of determination;

Step S328: is the second weighted coefficient of determination of the updated overlay parameters within the acceptable range? If so, go to step S330; else use a third group of wafers to replace the second group of wafers 24 to perform step S318 to update the second sub-recipe 20;

Step S330: the scanner 16 exposes other wafers according to the second sub-recipe 20.

Compared with the reticle thermal expansion calibration method 100, the reticle thermal expansion calibration method 300 does not extract a plurality of predetermined parameters from a plurality of overlay parameters as in step S106, but performs linear regression on each of the overlay parameters in step S306, and generates the first coefficient of determination accordingly. The reticle thermal expansion calibration method 300 also does not extract a plurality of update predetermined parameters from a plurality of update overlay parameters as in step S124, but performs linear regression on each of the updated overlay parameters in step S322, and generates the second coefficient of determination accordingly. The reticle thermal expansion calibration method 300 generates the first coefficient of determination and the second coefficient of determination in the same way as the reticle thermal expansion calibration method 100. The difference is that the reticle thermal expansion calibration method 300 generates the first coefficients of determination and the second coefficients of determination for all of the overlay parameters, not just the first coefficients of determination and the second coefficients of determination of the predetermined parameters. And the reticle thermal expansion calibration method 300 can perform linear combination on all of the first coefficients of determination to generate the first weighted determination coefficient, and can perform linear combination on all of the second coefficients of determination to generate the second weighted determination coefficient.

The embodiments provide reticle thermal expansion calibration methods. If the coefficient of determination is outside the acceptable range, the coefficient of determination will be updated until it is within the acceptable range, thus avoiding the use of incorrect sub-recipe to expose following wafers. This would allow products to meet specifications and improve product yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reticle thermal expansion calibration method comprising:
exposing, by a scanner, a first group of wafers using a reticle;
generating, by a computing system, a first sub-recipe based on temperature data collected during the exposure of the first group of wafers, wherein the first sub-recipe comprises exposure parameters for subsequent wafer exposures;
performing, by the computing system, data mining and data parsing on the collected temperature data to generate a plurality of overlay parameters for the first group of wafers;
extracting, by the computing system, a plurality of predetermined parameters from the plurality of overlay parameters for the first group of wafers, wherein the predetermined parameters are related to reticle thermal expansion compensation;
performing, by the computing system, a linear regression on each of the predetermined parameters; and
generating, by the computing system, a first coefficient of determination for each of the predetermined parameters;
calibrating, by the computing system, the reticle thermal expansion compensation based on the first coefficient of determination for each of the predetermined parameters; and
exposing, by the scanner, subsequent wafers using the calibrated reticle thermal expansion compensation.

2. The method of claim 1 further comprising:
if a plurality of first coefficients of determination of the predetermined parameters are all within an acceptable range, exposing subsequent wafers according to the first sub-recipe.

3. The method of claim 1 further comprising:
if at least one first coefficient of determination of at least one predetermined parameter of the predetermined parameters is outside an acceptable range:
exposing, by the scanner, a second group of wafers;
generating, by the computing system, a second sub-recipe based on temperature data collected during the exposure of the second group of wafers, wherein the second sub-recipe comprises exposure parameters for the subsequent wafer exposures;
performing, by the computing system, data mining and data parsing on the temperature data collected during the exposure of the second group of wafers to generate a plurality of updated overlay parameters for the second group of wafers;
extracting, by the computing system, a plurality of updated predetermined parameters from the plurality of updated overlay parameters for the second group of wafers;
performing, by the computing system, a linear regression on each of the updated predetermined parameters; and
generating, by the computing system, a second coefficient of determination for each of the updated predetermined parameters.

4. The method of claim 3 further comprising:
if a plurality of second coefficients of determination of the predetermined parameters are all within the acceptable range, exposing subsequent wafers according to the second sub-recipe.

5. The method of claim 3 wherein the second coefficient of determination for each of the updated predetermined parameters is generated according to a following equation:

$$R_j^2 = 1 - \frac{\sum_{i=1}^{N}(ActY_i - PredY_i)^2}{\sum_{i=1}^{N}(ActY_i - Avg(ActY))^2}$$

wherein:
$R_j^2$ is the second coefficient of determination;
N is number of wafers of the second group of wafers, N being an integer greater than 2;
$ActY_i$ is an actual value of an ith wafer of the second group of wafers corresponding to each of the updated predetermined parameters;
$PredY_i$ is a predicated value of the ith wafer of the second group of wafers corresponding to each of the updated predetermined parameters; and
$Avg(ActY)$ is an average value of the second group of wafers corresponding to each of the updated predetermined parameters.

6. The method of claim 5 wherein for each of the updated predetermined parameters, if $1 \geq R_j^2 > 0.9$, then the second coefficient of determination is within the acceptable range.

7. The method of claim 1 further comprising:
performing, by the computing system, a linear combination to a plurality of first coefficients of determination of the predetermined parameters to generate a first weighted coefficient of determination; and
if the first weighted coefficient of determination is within an acceptable range, exposing subsequent wafers according to the first sub-recipe.

8. The method of claim 1 further comprising:
performing, by the computing system, a linear combination to a plurality of first coefficients of determination of the predetermined parameters to generate a first weighted coefficient of determination;
if the first weighted coefficient of determination is outside an acceptable range:
exposing, by the scanner, a second group of wafers using the reticle;
generating, by the computing system, a second sub-recipe based on temperature data collected during the exposure of the second group of wafers;
performing, by the computing system, data mining and data parsing to generate a plurality of updated overlay parameters for the second group of wafers;
extracting, by the computing system, a plurality of updated predetermined parameters from the plurality of updated overlay parameters for the second group of wafers;

performing, by the computing system, a linear regression on each of the updated predetermined parameters; and generating, by the computing system, a second coefficient of determination for each of the updated predetermined parameters.

9. The method of claim 8 further comprising:

performing the linear combination to a plurality of second coefficients of determination of the updated predetermined parameters to generate a second weighted coefficient of determination; and if the second weighted coefficient of determination is within the acceptable range, exposing subsequent wafers according to the second sub-recipe.

10. The method of claim 9 wherein the second coefficient of determination for each of the updated predetermined parameters is generated according to a following equation:

$$R_j^2 = 1 - \frac{\sum_{i=1}^{N}(ActY_i - PredY_i)^2}{\sum_{i=1}^{N}(ActY_i - Avg(ActY))^2}$$

wherein:

$R_j^2$ is the second coefficient of determination;

N is number of wafers of the second group of wafers, N being an integer greater than 2;

$ActY_i$ is an actual value of an ith wafer of the second group of wafers corresponding to each of the updated predetermined parameters;

$PredY_i$ is a predicated value of the ith wafer of the second group of wafers corresponding to each of the updated predetermined parameters;

Avg(ActY) is an average value of the second group of wafers corresponding to each of the updated predetermined parameters; and if the second weighted coefficient of determination is between 0.9 and 1, then the second weighted coefficient of determination is within the acceptable range.

\* \* \* \* \*